United States Patent
Weng et al.

(10) Patent No.: US 7,528,420 B2
(45) Date of Patent: May 5, 2009

(54) IMAGE SENSING DEVICES AND METHODS FOR FABRICATING THE SAME

(75) Inventors: Jui-Peng Weng, Miaoli County (TW); Tzu-Han Lin, Hsinchu (TW); Pai-Chun Peter Zung, Hsinchu (TW)

(73) Assignee: Visera Technologies Company Limited, Hsinchu (TW)

( * ) Notice: Subject to any disclaimer, the term of this patent is extended or adjusted under 35 U.S.C. 154(b) by 26 days.

(21) Appl. No.: 11/752,427

(22) Filed: May 23, 2007

(65) Prior Publication Data

US 2008/0290438 A1 Nov. 27, 2008

(51) Int. Cl.
| | |
|---|---|
| H01L 29/22 | (2006.01) |
| H01L 29/227 | (2006.01) |
| H01L 33/00 | (2006.01) |
| H01L 27/15 | (2006.01) |
| H01L 29/267 | (2006.01) |
| H01L 31/12 | (2006.01) |
| H01L 29/417 | (2006.01) |
| H01L 29/74 | (2006.01) |
| H01L 31/111 | (2006.01) |
| H01L 27/148 | (2006.01) |
| H01L 29/768 | (2006.01) |
| H01L 31/0203 | (2006.01) |
| H01L 31/00 | (2006.01) |

(52) U.S. Cl. ............................. 257/98; 257/81; 257/99; 257/117; 257/118; 257/233; 257/433; 257/434; 257/466; 257/911; 257/E33.056; 257/E33.057; 257/E33.058; 257/E33.059; 257/E25.032

(58) Field of Classification Search ................... 257/81, 257/99, 117–118, 233, 433–434, 466, 911, 257/E33.056–E33.059, E25.032
See application file for complete search history.

(56) References Cited

U.S. PATENT DOCUMENTS

| | | | | |
|---|---|---|---|---|
| 6,059,188 | A * | 5/2000 | diFazio et al. | 235/462.36 |
| 6,545,711 | B1 * | 4/2003 | Perner et al. | 348/294 |
| 6,621,161 | B2 * | 9/2003 | Miyawaki | 257/723 |
| 6,777,767 | B2 | 8/2004 | Badehi | |
| 6,969,639 | B2 * | 11/2005 | Cho et al. | 438/118 |
| 6,982,470 | B2 * | 1/2006 | Omori | 257/434 |
| 7,056,765 | B2 * | 6/2006 | Loo et al. | 438/106 |
| 7,083,999 | B2 * | 8/2006 | Hashimoto | 438/60 |
| 7,115,961 | B2 * | 10/2006 | Watkins et al. | 257/433 |
| 7,247,509 | B2 * | 7/2007 | Yamauchi et al. | 438/33 |
| 7,265,330 | B2 * | 9/2007 | Farnworth et al. | 250/208.1 |

(Continued)

*Primary Examiner*—Ida M Soward
(74) *Attorney, Agent, or Firm*—Thomas, Kayden, Horstemeyer & Risley

(57) ABSTRACT

Image sensing devices and methods for fabricating the same are provided. An exemplary image sensing device includes a first substrate having a first side and a second side opposing each other. A plurality of image sensing elements is formed in the first substrate at the first side. A conductive via is formed through the first substrate, having a first surface exposed by the first substrate at the first side and a second surface exposed by the first substrate at the second side. A conductive pad overlies the conductive via at the first side and is electrically connecting the image sensing elements. A conductive layer overlies the conductive via at the second side and electrically connects with the conductive pad. A conductive bump is formed over a portion of the conductive layer. A second substrate is bonded with the first substrate at the first side.

11 Claims, 21 Drawing Sheets

U.S. PATENT DOCUMENTS

| | | | |
|---|---|---|---|
| 7,273,765 B2 * | 9/2007 | Minamio et al. | 438/68 |
| 7,288,757 B2 * | 10/2007 | Farnworth et al. | 250/239 |
| 7,321,455 B2 * | 1/2008 | Kinsman | 359/245 |
| 2005/0253213 A1 * | 11/2005 | Jiang et al. | 257/433 |
| 2005/0275049 A1 * | 12/2005 | Kirby et al. | 257/433 |
| 2006/0001147 A1 * | 1/2006 | Tomita et al. | 257/690 |
| 2006/0040421 A1 * | 2/2006 | Farnworth et al. | 438/106 |
| 2007/0029654 A1 * | 2/2007 | Sunohara et al. | 257/678 |
| 2007/0045632 A1 * | 3/2007 | Oliver et al. | 257/79 |
| 2007/0096235 A1 * | 5/2007 | Boettiger et al. | 257/434 |
| 2008/0118241 A1 * | 5/2008 | TeKolste et al. | 396/439 |
| 2008/0290435 A1 * | 11/2008 | Oliver et al. | 257/432 |

* cited by examiner

IMAGE SENSING DEVICES AND METHODS FOR FABRICATING THE SAME

BACKGROUND

The invention relates to integrated circuit (IC) packages and more particularly to image sensing devices and methods for fabricating the same.

An essential step in the manufacture of all integrated circuit devices is what is known as the packaging step. Packaging involves mechanical and environmental protection of a silicon chip formed at the center of the integrated circuit and provides electrical interconnection between predetermined locations on the silicon chip and external electrical terminals.

Existing package techniques for mounting a die on a substrate via the bonding points on both the die and the substrate include ball grid array (BGA), wire bonding, and flip chip. The inner traces aid in fan out the bonding points on the bottom of the substrate. The solder balls are separately planted on the bonding points to serve as an interface for electrical connection of the die to the external circuitry.

BGA packages require wiring or flip chip for mounting the die on the substrate. The inner traces in the substrate fan out the bonding points on the substrate, and electrical connection to the external circuitry is carried out by the solder balls on the bonding points. This method fails to reduce the distance of the signal transmission path but in fact increases the signal path distance, increasing signal delay and attenuation and degrading chip performance.

Thus, wafer level chip scale package (WLCSP) has received attention in recent years as a three-dimensional mounting technology as well as a new packaging technology. The WLCSP provides a small package having about the same outside dimensions as a die packaged therein. Further, WLCSP is advantageous in enabling printing of the redistribution circuit directly on the die by using the peripheral area of the die as the bonding points. This is made possible by redistributing an area array on the surface of the die, allowing the entire area of the die to be fully utilized. The bonding points are located on the redistribution circuit by forming flip chip bumps, thus, the bottom side of the die connects directly to the printed circuit board (PCB) with micro-spaced bonding points.

FIG. 1 shows a conventional integrated circuit package formed by WLCSP techniques as disclosed in U.S. Pat. No. 6,777,767, including a microlens array 100 formed on a substrate 102. Underlying the substrate 102 and sealed thereto by epoxy 104 is a packaging layer 106, typically formed of glass, along edges of which are formed electrical contacts 108, typically defining bumps 110. Conductive pads 112 connect substrate 102 to electrical contacts 108. A packaging layer 114 formed of glass and associated spacer elements 116 are sealed by means of an adhesive such as epoxy 118 and are formed over substrate 102 defining a cavity 120 between the microlens array 100 and the packaging layer 114. The packaging layer 114 is transparent and may have formed thereon a dichroic filter and/or anti-reflective coating.

In the conventional integrated circuit package illustrated in FIG. 1, however, there exists a possibility of the conductive pads 112 and the electrical contacts 108 disconnecting at a point of contact therebetween because the area of the point of contact is very small. A problem also arises in step coverage of the conductive pads 112. Additionally, coefficients of thermal expansion (CTE) of the epoxy 118, the conductive pads 112 and the electrical contacts 108 may result in mismatching and delamination, thus degrading of IC package reliability.

SUMMARY

Thus, an improved image sensing device and a method for fabricating the same capable of preventing disconnection of interconnects and reducing CTE mismatch between layers therein is desirable.

An exemplary embodiment of an image sensing device comprises a first substrate having a first side and a second side opposing each other. A plurality of image sensing elements is formed in the first substrate at the first side. A conductive via is formed through the first substrate, having a first surface exposed by the first substrate at the first side and a second surface exposed by the first substrate at the second side. A conductive pad is formed over portions of the first substrate at the first side and overlies the conductive via and is electrically connected with the image sensing elements. A conductive layer is formed over portions of the first substrate at the second side thereof and overlies the conductive via and electrically connecting the conductive pad. A conductive bump is formed over a portion of the conductive layer. A second substrate is bonded with the first substrate at the first side, wherein the second substrate is formed with a recess therein and thereby forms a cavity between the first and the second substrates.

An exemplary embodiment of a method for fabricating an image sensing device package comprises provide a first substrate having a first side and a second side opposing each other. A plurality of openings is formed in the first substrate at the first side, wherein the openings define a plurality of active regions and cutting regions over the first substrate at the first side. A conductive via is formed in the openings and a conductive pad is formed over each of the conductive via in the openings, wherein the conductive pad overlies portions of the substrate in the active regions. A plurality of image sensing elements is formed in the first substrate in the active regions at the first side. An internal structure is formed in the active regions, overlying the image sensor elements and the conductive pad and electrically connecting the conductive pad, wherein the interconnect structure comprises color filters and interconnection features. A plurality of microlenses is formed over the internal structure, substantially aligning with the image sensing elements. A second substrate is mounted with the first substrate from the first side, wherein the second substrate is formed with a plurality of recesses therein and the recesses substantially align with the active regions, thereby forming cavities between the second substrate and the first substrate. A thinning process is performed on the first substrate at the second side, exposing a surface of the conductive vias from the second side. A conductive layer is formed over portions of the first substrate at the second side thereof, overlying each of the conductive vias and electrically connecting the conductive pad. A conductive bump is formed over a portion of the conductive layer.

Another exemplary embodiment of a method for fabricating an image sensing device package comprises providing a first substrate having a first side and a second side opposing each other. A plurality of image sensing elements is formed in portions of the first substrate at the first side. A contact pad is formed over a portion of the first substrate adjacent to the image sensing elements, electrically connecting the image sensing elements. A plurality of openings is formed in the first substrate at the first side, wherein the openings define a plurality of active regions comprising the image sensing elements and the conductive pad, and a plurality of cutting regions over the first substrate at the first side. A conductive via is formed in the openings. A conductive pad is formed over each of the conductive via in the openings, wherein the conductive pad overlies portions of the contact pad in the active regions. A plurality of microlenses is formed over the image sensing elements. A second substrate is mounted with the first substrate from the first side, wherein the second substrate is formed with a plurality of recesses therein and the recesses substantially align with the active regions, thereby forming cavities between the second substrate and the first substrate. A thinning process is performed on the first substrate at the second side, exposing a surface of the conductive vias from the second side. A conductive layer is formed over portions of the first substrate at the second side thereof, overlying each of the conductive vias and electrically connecting the conductive pad. A conductive bump is formed over a portion of the conductive layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2~11 are schematic diagrams showing cross sections in various fabrication steps for forming image sensing devices according to an exemplary embodiment, respectively.

Figure 2:
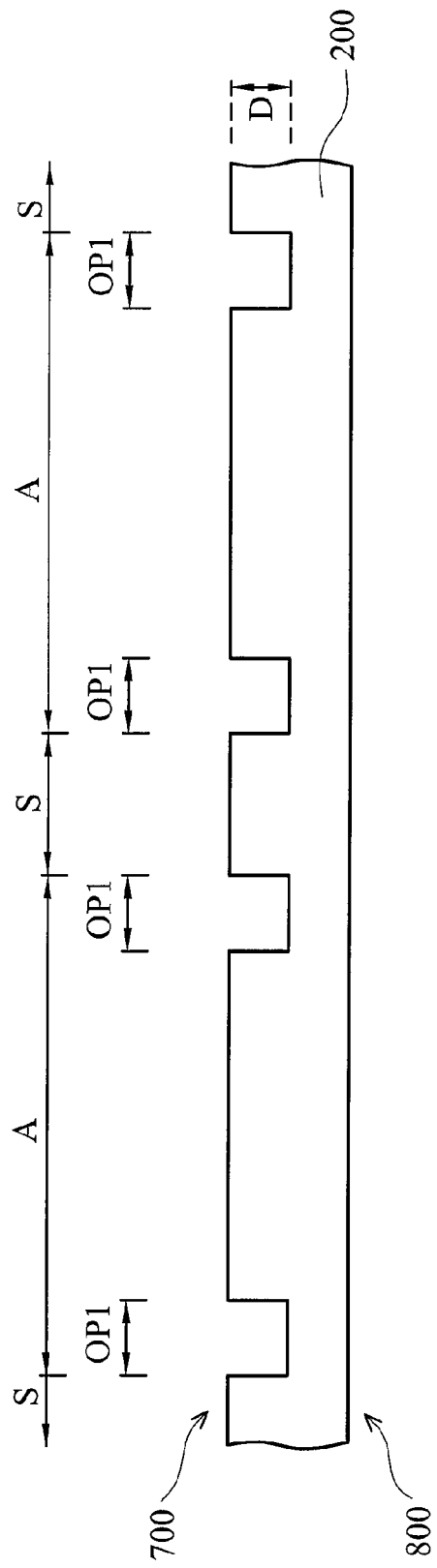
FIGS. 2~11 are schematic diagrams of various fabrication steps for fabricating image sensing devices according to an embodiment of the invention.

In FIG. 2, a semiconductor substrate 200, for example silicon substrate, is first provided. A plurality of openings OP1 is then formed in the substrate 200 at a side 700 through conventional photolithography and etching steps (both not shown). The openings OP1 are isolated from each other and define a plurality of active regions A and cutting regions S over the substrate 200. The cutting regions S are formed at a place between two adjacent openings OP1. As shown in FIG. 2, each of the openings OP1 is formed at a depth D of about 100~200 µm from a top surface of the substrate 200. Another side 800 of the substrate 200 opposing to the side 700 has no openings therein and remains planar.

Figure 3:
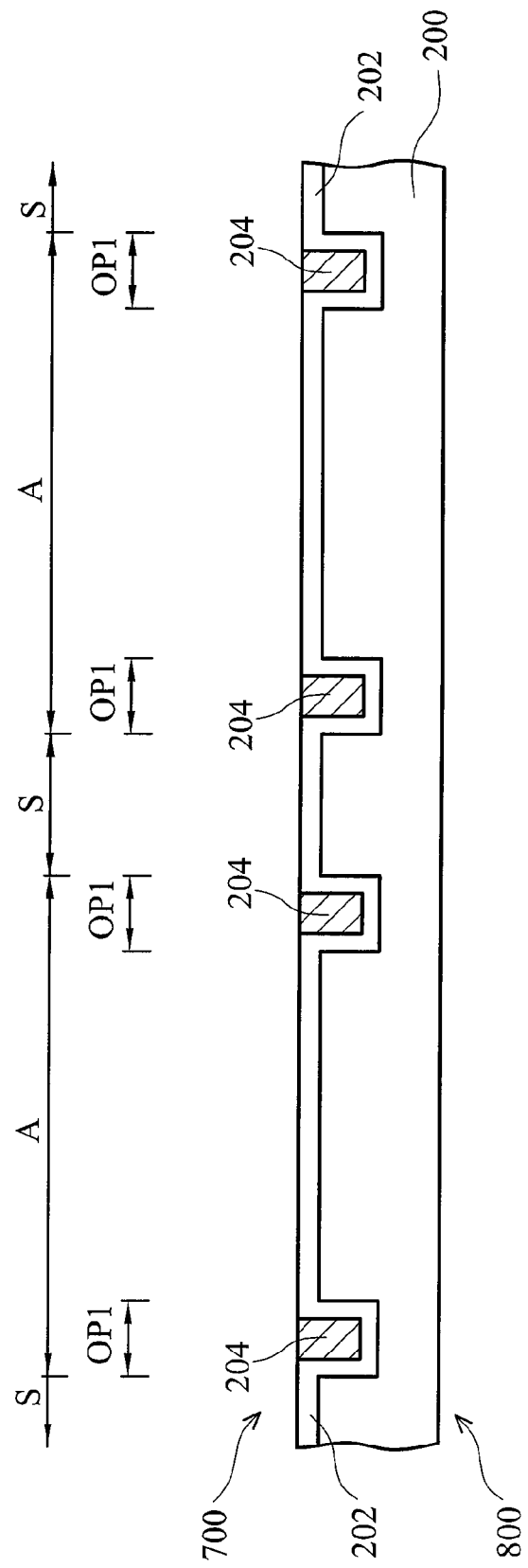

In FIG. 3, an insulating layer 202 is then conformably formed over the substrate 200 from the side 700 and in the openings OP1 illustrated in FIG. 2. A layer of conductive material is blanketly formed over the insulating layer 202, filling the openings OP1. The portion of the conductive material above the insulating layer 202 is then removed by a planarization step (not shown), such as a chemical mechanical polishing (CMP), thereby respectively leaving a conductive via 204 in of the openings OP1. As shown in FIG. 3, the conductive via 204 is substantially coplanar with the insulating layer 202 and is isolated from the substrate 200 by the insulating layer 202. In some embodiments, the insulating layer 202 may comprise oxide and the conductive vias 204 comprise copper, tungsten, or conductive epoxy.

Figure 4:
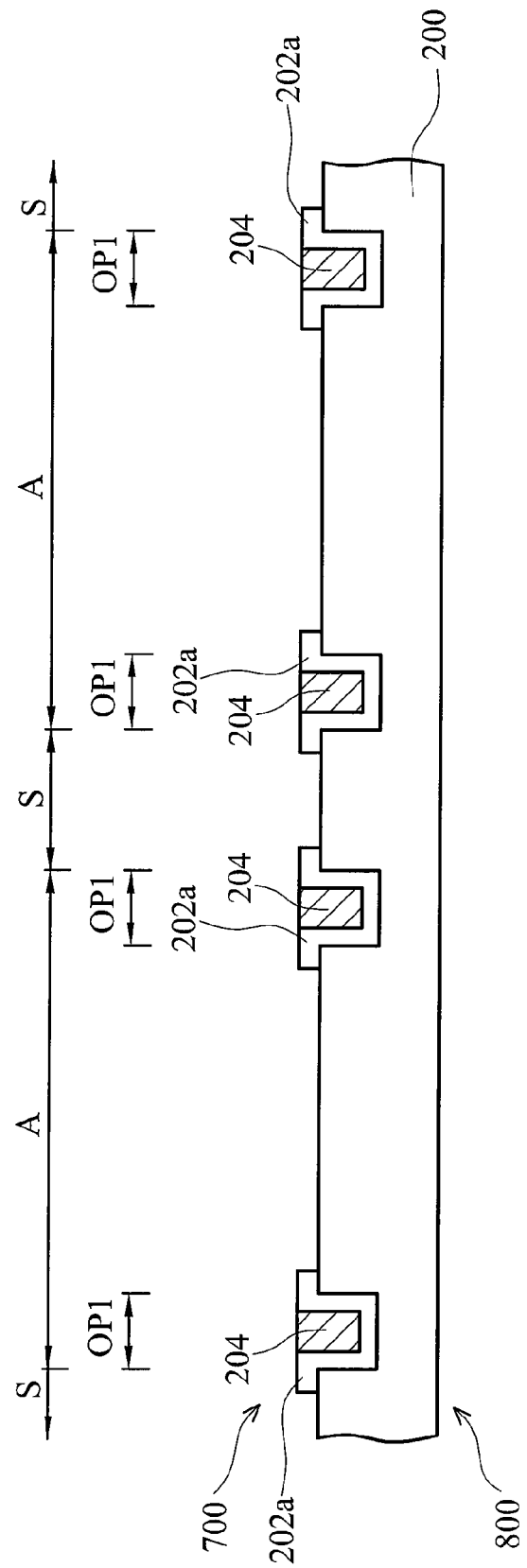

In FIG. 4, the insulating layer 202 illustrated in FIG. 3 is then patterned by conventional photolithography and etching steps (both not shown) to expose a portion of the substrate 200 in the active regions A. As shown in FIG. 4, a portion of the insulating layer 202 in the cutting regions S is also removed and the removal of the insulating layer 202 in the cutting regions S is optional.

Figure 5:
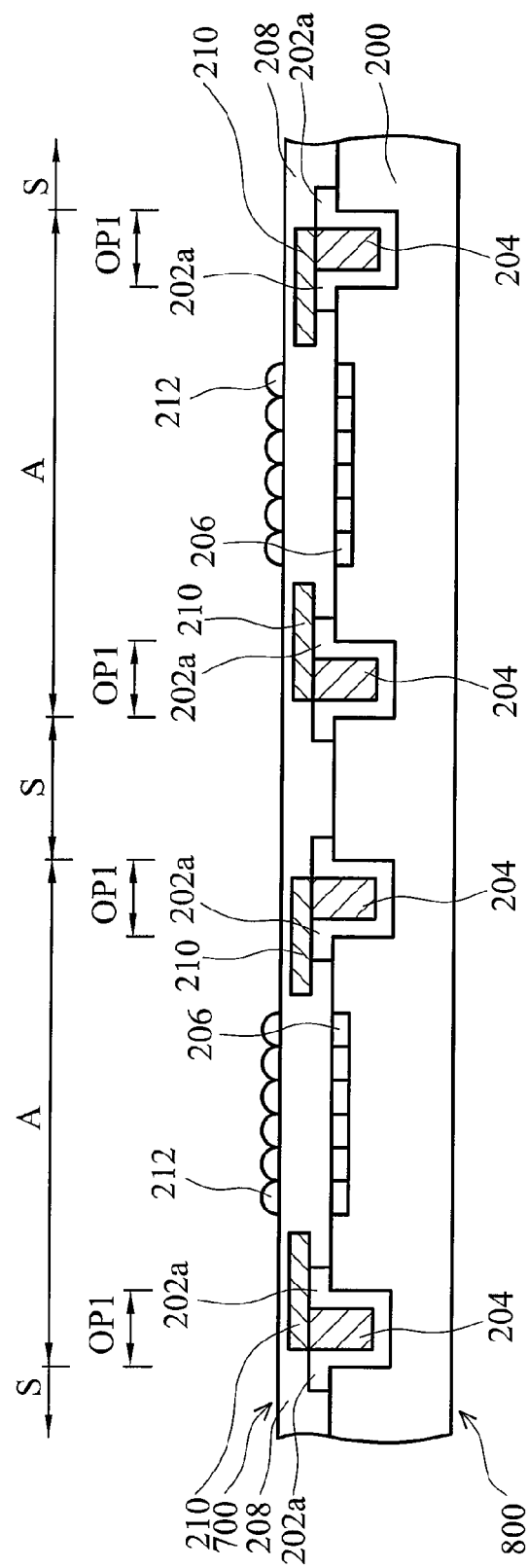

In FIG. 5, a semiconductor device, such as an image sensing device, is next fabricated in the substrate 200 exposed by the insulating layer 202 in the active regions A by well known device fabrication. As shown in FIG. 5, a plurality of image sensing elements 206 are now formed in the substrate 200 in the active regions A. The image sensing elements 206 can be, for example, photodiodes or complementary metal-oxide-semiconductor (CMOS) image sensor, and are merely illustrated as the image sensing elements 206 in FIG. 5 for simplicity. Next, an internal structure 208 including functional components such as color filter layers for color image presenting and conductive vias/line insulated by dielectric materials for functioning signal interconnection is formed over the substrate 200. A conductive pad 210 is also provided within the internal structure 208 and overlies each conductive via 204, thereby electrically connecting the conductive element (not shown) in the internal structure 208. A plurality of microlenses 212 is then formed over the internal structure 208 in the active regions A and substantially aligns with the underlying image sensing elements 206, respectively.

Figure 6:
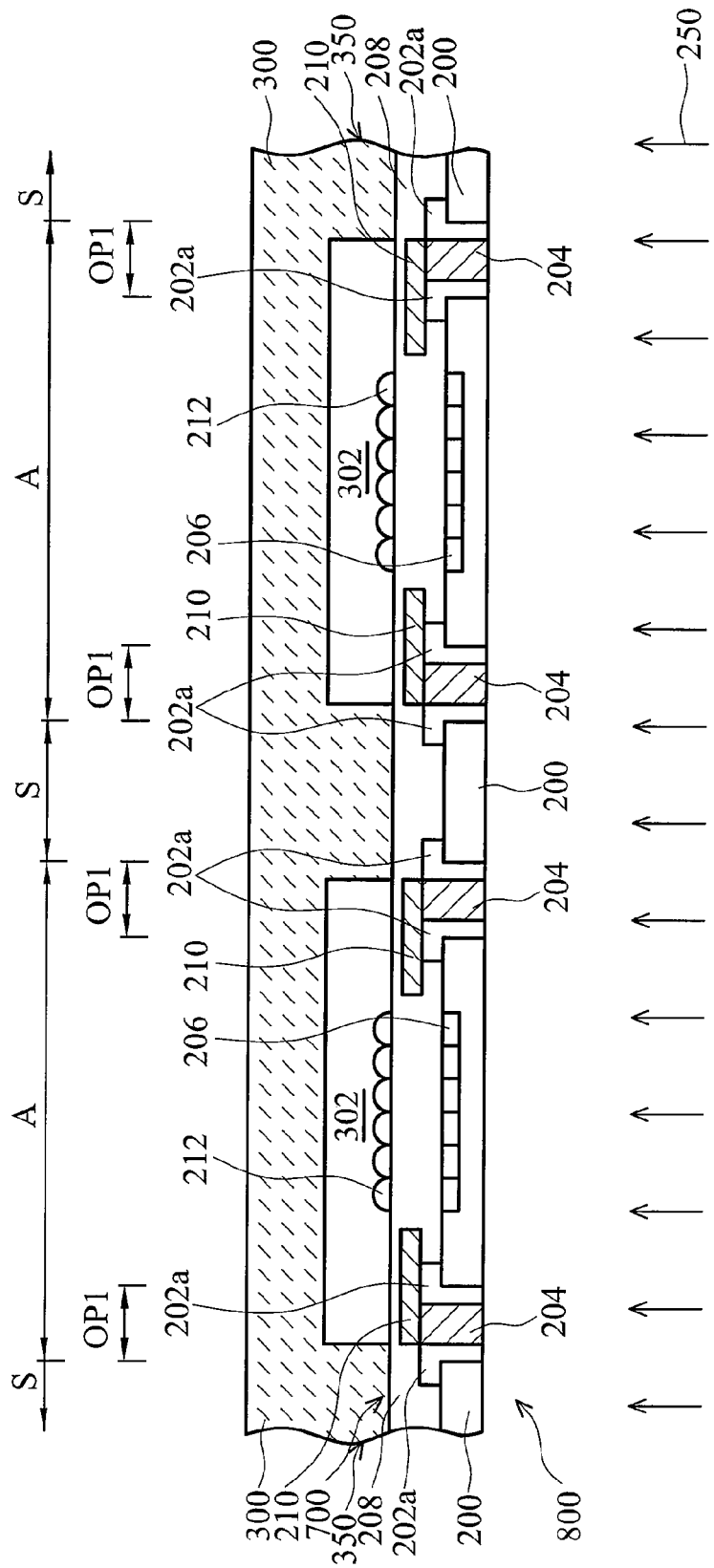

In FIG. 6, a transparent substrate 300, for example glass substrate or plastic substrate, is then bonded with the structure as illustrated in FIG. 5 from the side 700 of the substrate 200. The transparent substrate 300 is bonded with the substrate 200 by methods such as glue adhesion or eutectic bond. As shown in FIG. 6, the transparent substrate 300 is formed with recesses therein defined by a plurality of dam structures 350 thereon. At this time, these dam structures 350 are integrated with transparent substrate 300 as a part thereof. The dam structures 350 are formed by performing conventional photolithography and etching steps (both not shown) to the transparent substrate 300 and thereby define recesses between. The recesses of the transparent substrate 300 substantially locate at a position over the active regions A of the substrate 200. Cavities 302 are thus formed between the substrate 200 and the transparent substrate 300 and spaces exist between the microlenses 212 and the transparent substrate 300. Next, a thinning process 250 is performed on the substrate 200 from side 800 thereof, thereby exposing a surface of the conductive vias 204. The thinning process 250 may comprise multiple processing steps such as grinding, etching or other film thickness reducing steps. Portions of the insulating layer 202a are also removed in the thinning process 250.

Figure 7:
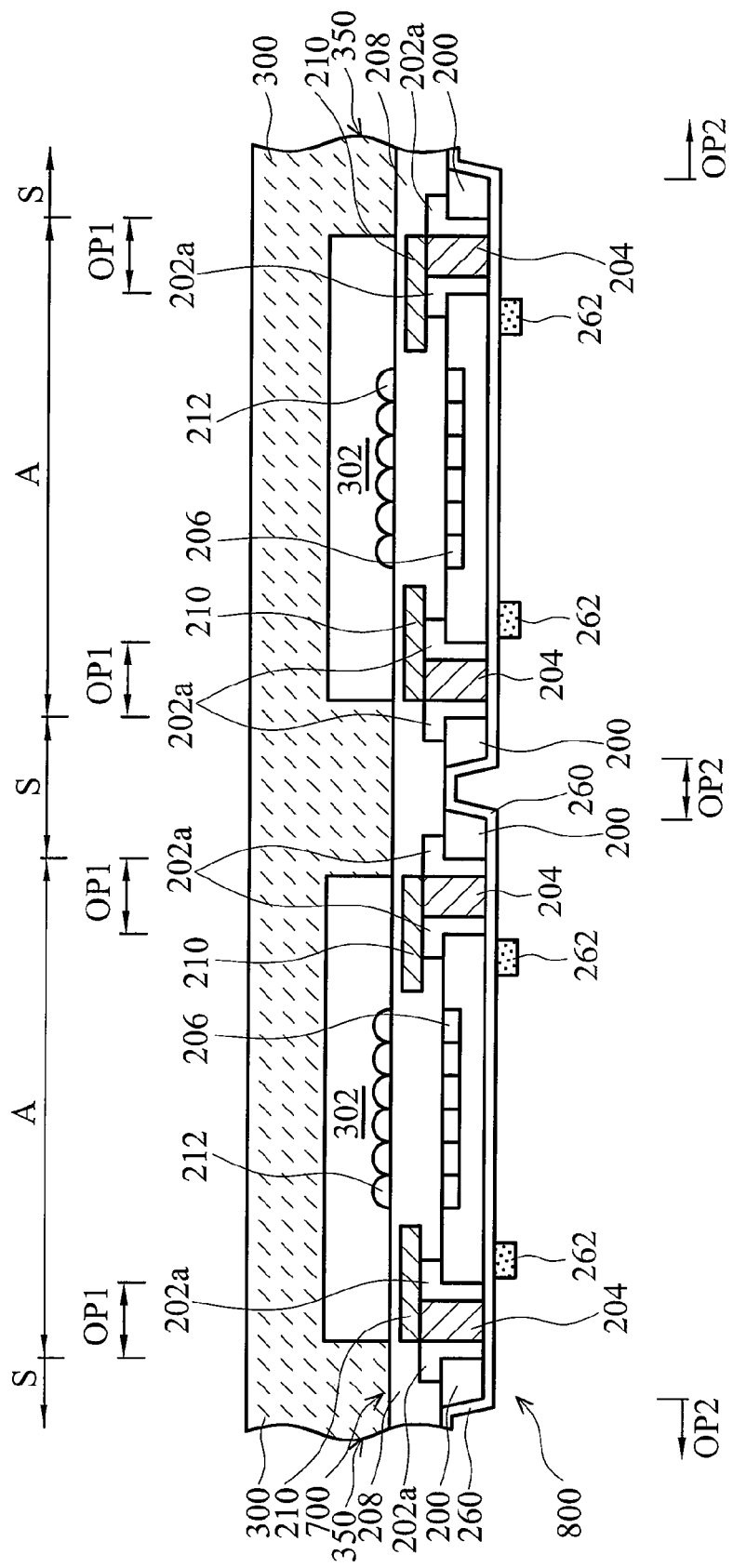

In FIG. 7, portions of the substrate 200 in the cutting regions S illustrated in FIG. 6 are etched from the side 800 thereof, forming a plurality of openings OP2 therein. A dielectric layer 260 is then conformably formed over the substrate 200 and in the openings OP2 from the side 800 thereof. Next, a patterned post layer 262 is formed over portions of the dielectric layer 260 as a CTE buffering layer for adjusting the CTE difference between the dielectric layer 260 and the sequentially formed layers (not shown). As shown in FIG. 7, the dielectric layer 260 may comprise oxide, nitride or epoxy. The patterned post layers 262 may comprise polyimide, benzocyclobutene(BCB) or epoxy to thereby reduce thermal effects between the dielectric layer 260 and the sequentially formed layers (not shown).

Figure 8:
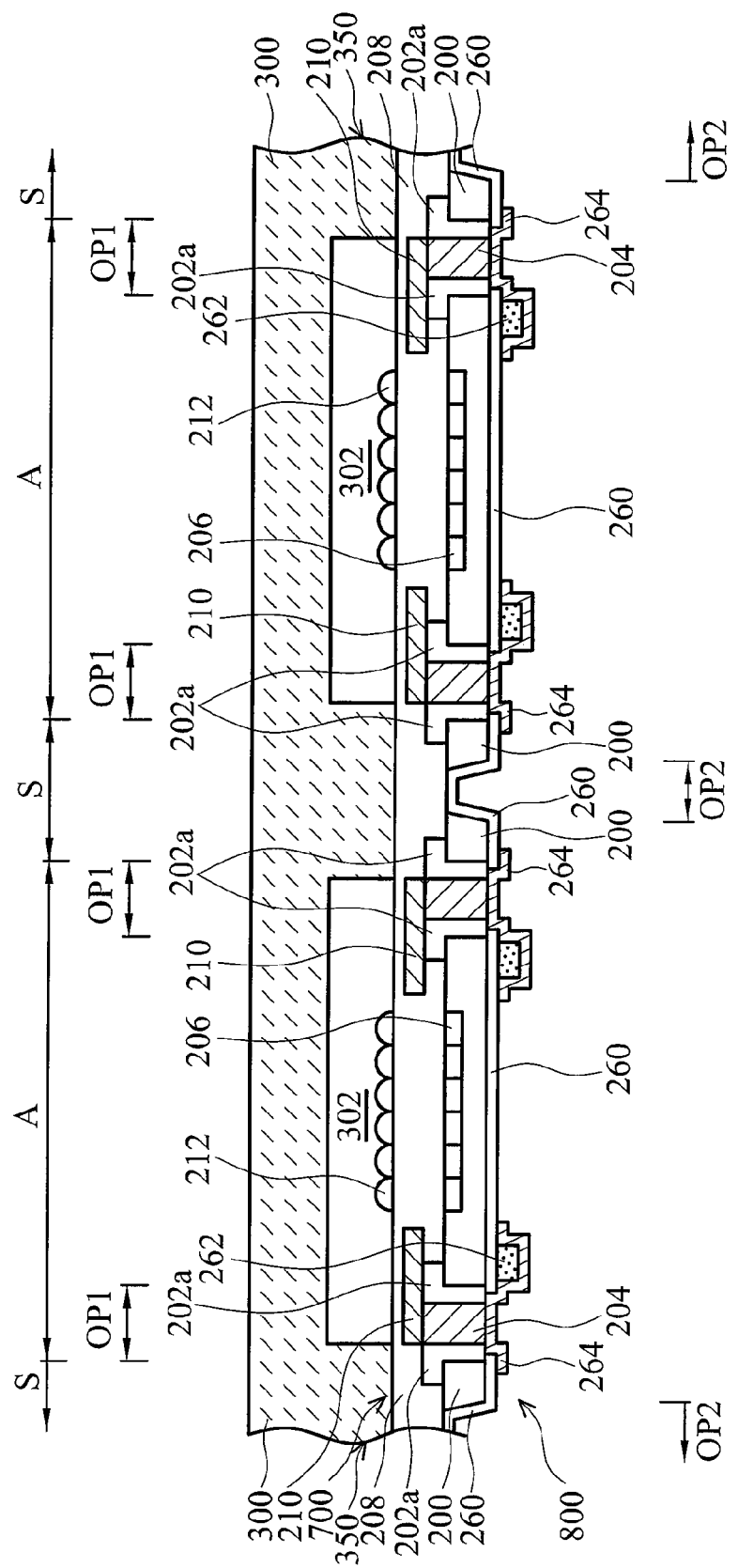

In FIG. 8, portions of the dielectric layer 260 are moved to expose each of the conductive vias 204. A layer of conductive material is then conformably formed over the dielectric layer 260, the post layer 262 and the conductive vias 204 and is then patterned to leave a conductive layer 264 overlying the substrate 200 and physically contacts the conductive vias 204. The conductive layer 264 also overlies the post layer 262.

Figure 9:
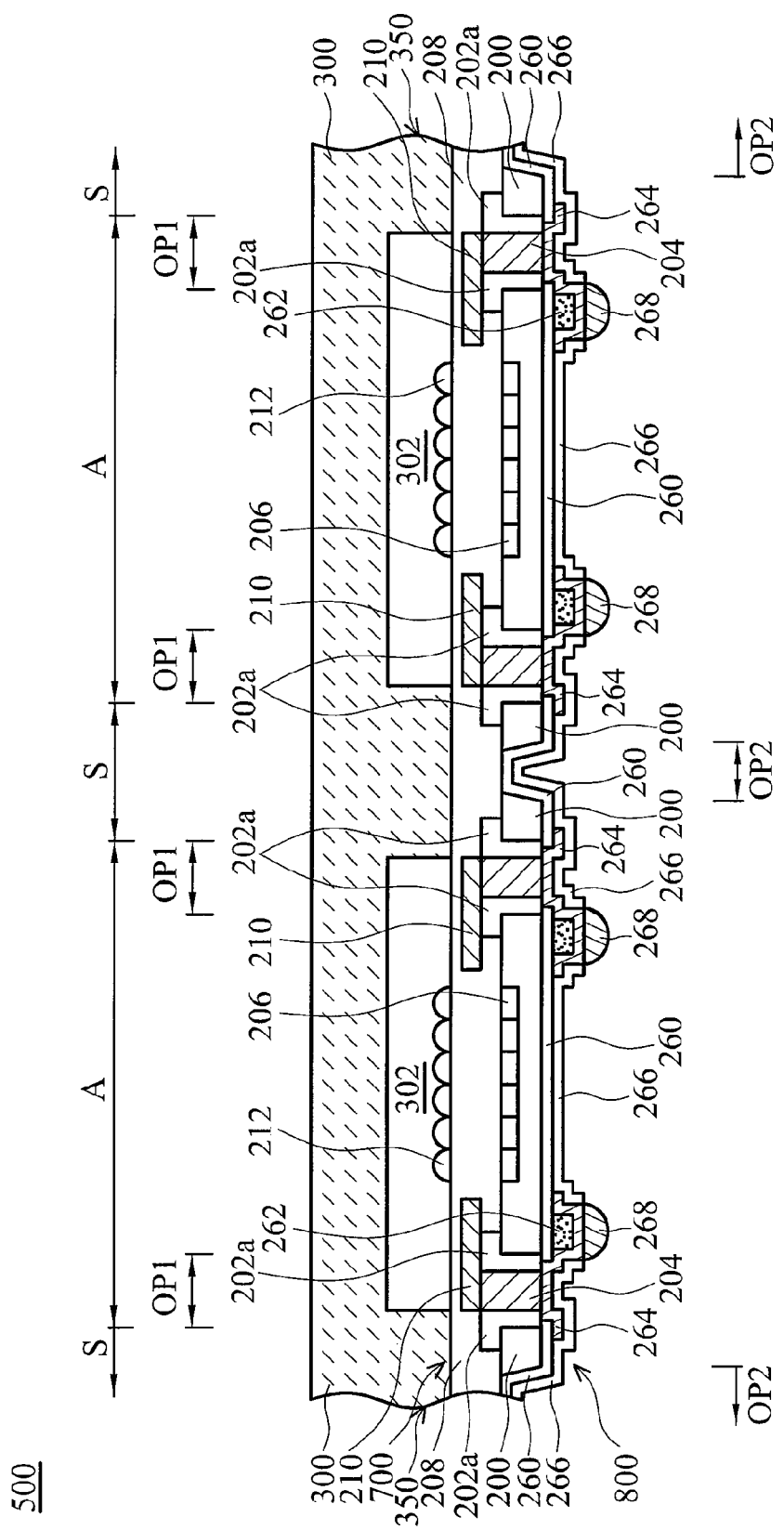

In FIG. 9, a layer of passivation material such as epoxy is then conformably formed over the structure illustrated in FIG. 8 from the side 800 and is patterned to leave a passivation layer 266 overlying the dielectric layer 260 and the conductive layers 264. The passivation layer 266 is then partially removed to expose portions of the conductive layer 264 as a place for planting conductive bump thereon. Next, a conductive bump 268 is formed on each of the conductive layer 264 exposed by the passivation layer 266.

Figure 10:
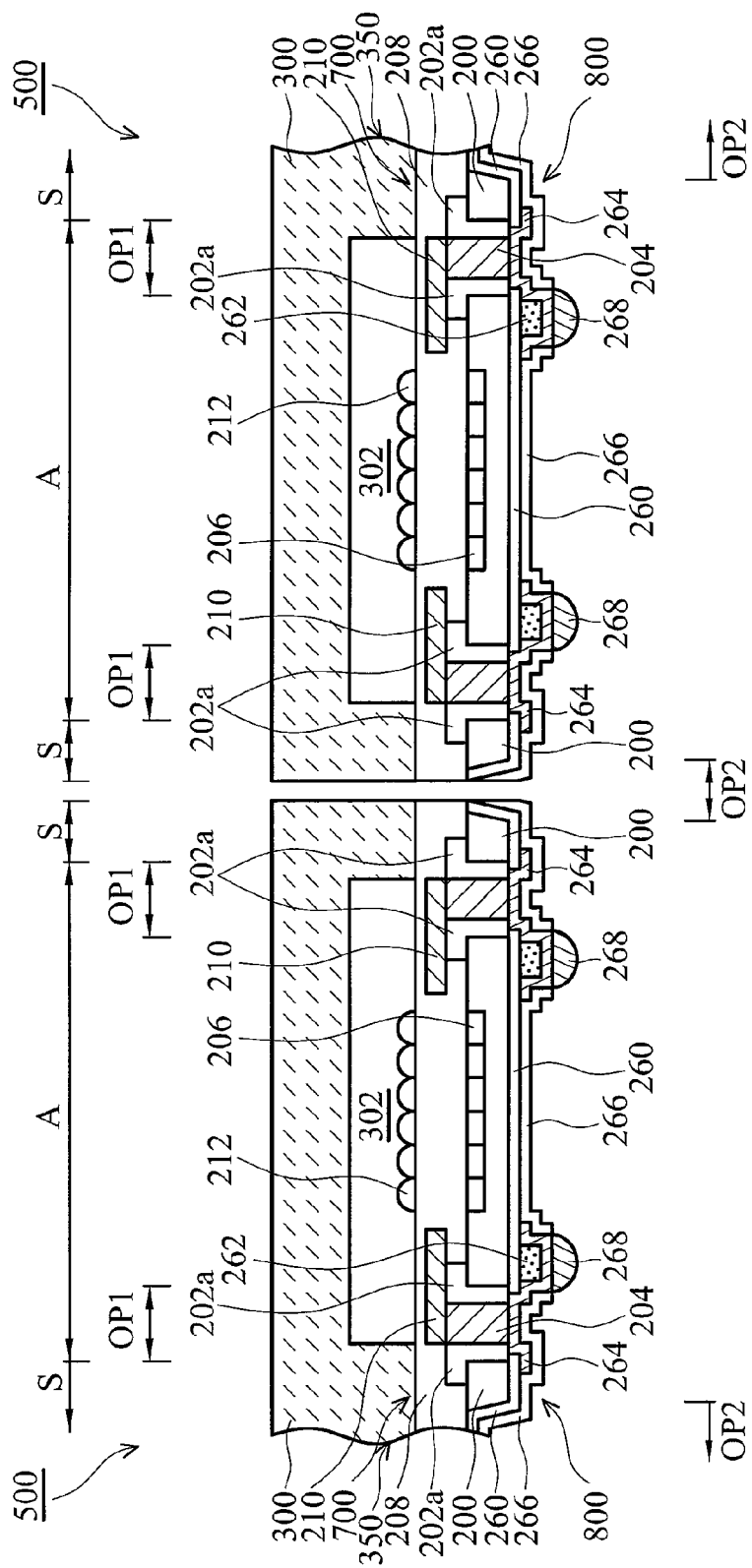

In FIG. 10, the structure illustrate in FIG. 9 is then diced to separate the structure illustrated in FIG. 9 at a place near the opening OP2 in the cutting region S, thereby forming a plurality of image sensing device packages 500.

Figure 11:
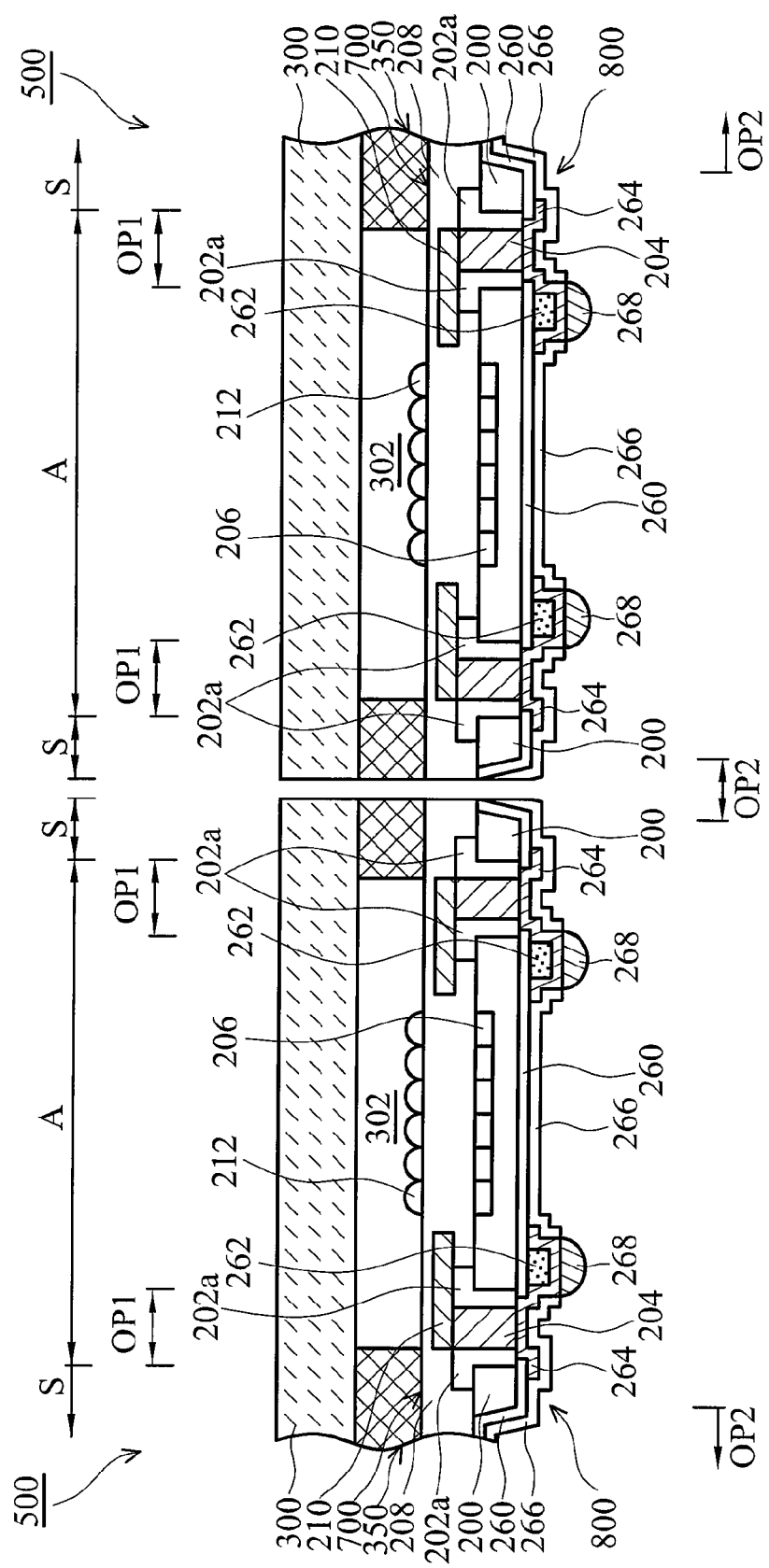

FIG. 11 is a schematic diagram showing another exemplary embodiment of image sensing device packages. Compared with the image sensing device packages 500 illustrated in FIG. 10, the dam structures 350 illustrated in FIG. 11 are different and are not integrated as a part of the transparent substrate 300. The dam structures 350 illustrated in FIG. 11 are now formed by spacers such as ball or roller of glass, plastic or silica materials typically used in liquid crystal display (LCD) fabrication and the transparent substrate 300 here is not processed by any etching process and no recess is formed therein. The height of the dam structure 350 can be adjusted by adding or reducing the amount of photospacer material and fabrication thereof is well known to those skilled in the art.

Figure 1:
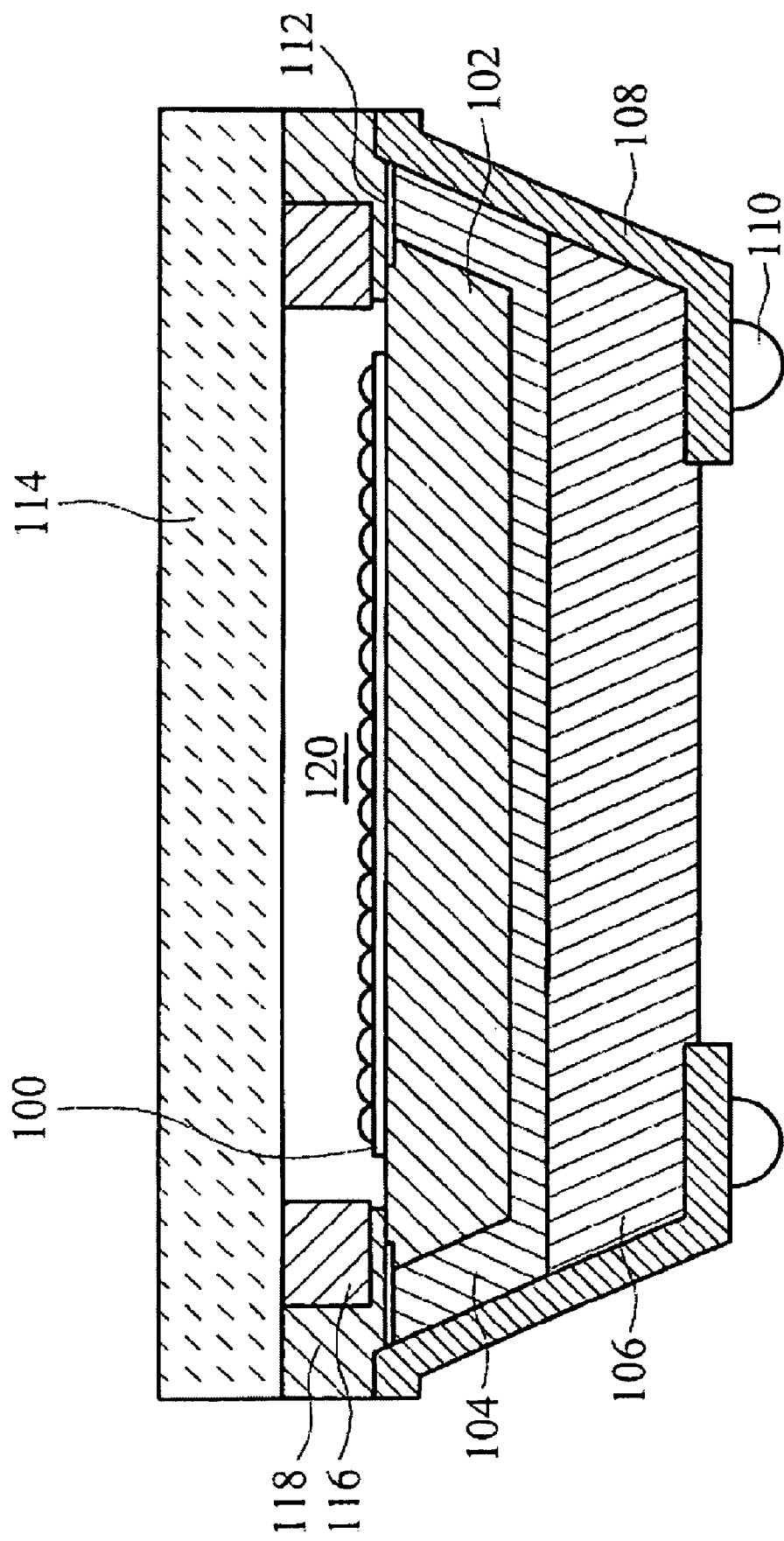
FIG. 1 shows a cross section of a conventional integrated circuit package.

In the above exemplary embodiments described through illustrations of FIGS. 2~11, the conductive vias 204 are now formed through the substrate 200 with image sensing elements formed thereon and the conductive pad 210 physically contacting the conductive via 204 for electrically connection of the image sensing elements. The conductive bumps 268 can thus electrically connect the image sensing elements formed in the substrate 200 through connections of the conductive layer 264, the conductive vias 204 and the conductive pads 210, thereby forming a conductive path therebetween. Compared with the conventional integrated circuit package as illustrated in FIG. 1, because the conductive vias 204 and the conductive pads 210 in the described embodiments are now embedded within the image sensing device packages rather than formed as a side of the package, a more robust package structure is formed. Disconnection between the conductive pads 210 and the conductive vias 204 can be also prevented because the conductive pads 210 now contact a top surface of the conduct plugs 204, thereby having a greater interface therebetween. Additionally, package size of the image sensing device can be also reduced through the described configuration. Because the conductive bumps 262 indirectly contact the conductive vias 204 through connections of the conductive layers 264, and the post layers 262 are provided for adjusting CTE mismatch between the conductive layer 264 and the passivation layer 260, delamination of the conductive vias 204, the conductive layers 260 and/or the conductive bumps is thus prevented.

FIGS. 12~21 are schematic diagrams showing cross sections in various fabrication steps for forming image sensing devices according to another exemplary embodiment.

Figure 12:
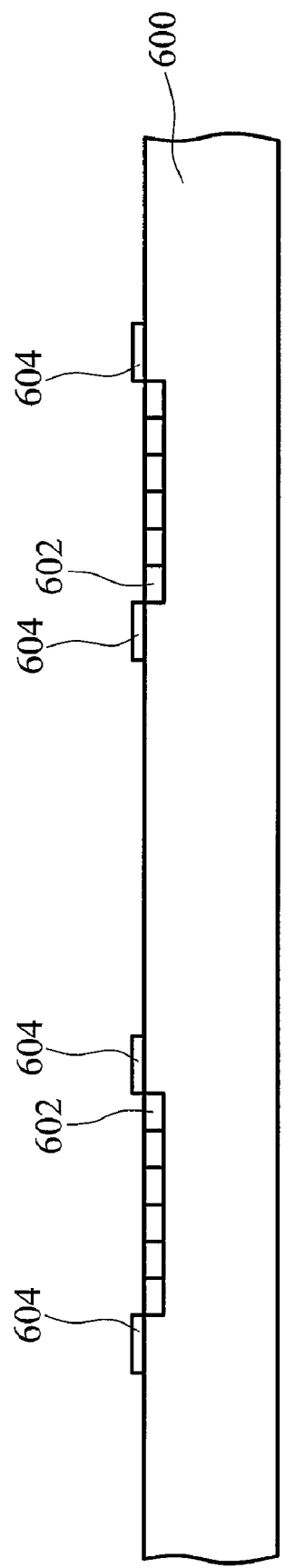
FIGS. 12~21 are schematic diagrams showing various fabrication steps for forming image sensing devices according to another embodiment of the invention.
Figure 13:
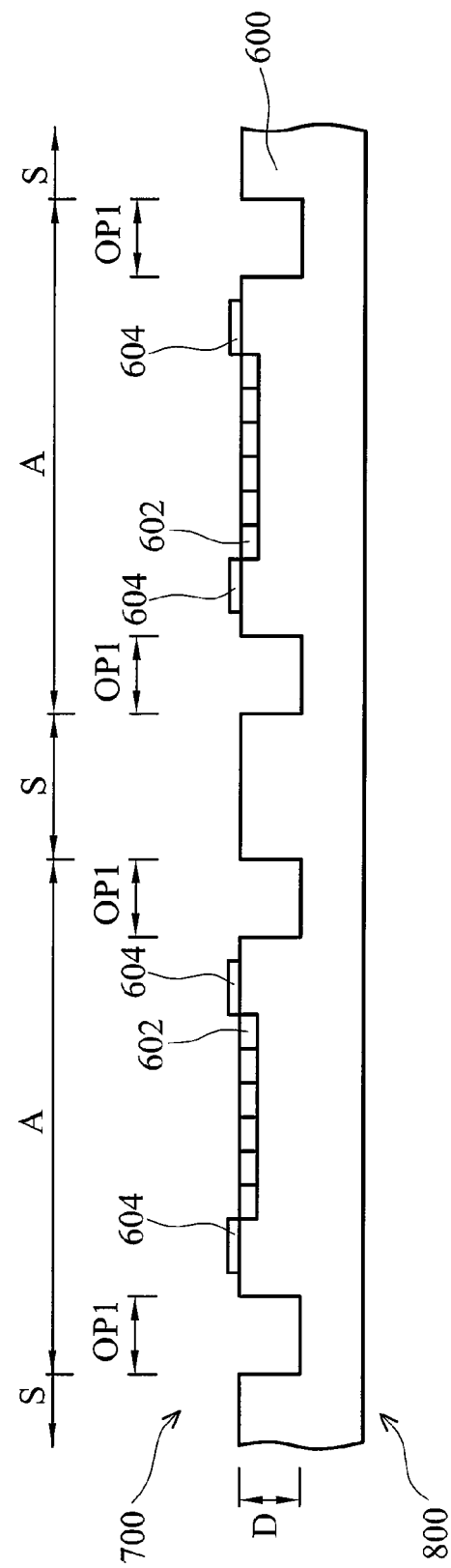

In FIG. 12, a semiconductor substrate 600, for example a silicon substrate, is first provided. Next, a semiconductor device, such as an image sensing device, is fabricated in portions of the substrate 600 at a side 700. As shown in FIG. 12, a plurality of image sensing elements 602 are now formed in the substrate 600 in active regions (as shown in FIG. 13) defined over the substrate 600. The image sensing elements 602 can be, for example, photodiodes or complementary metal-oxide-semiconductor (CMOS) image sensors, and are merely illustrated as the image sensing elements 602 in FIG. 12 for simplicity. Also provided is a contact pad 604 formed over the substrate 600 at each side of the image sensing elements 602 for sequential electrical connection. The contact pad 604 electrically connects the image sensing elements 602 but connection therebetween are not shown here, for simplicity.

In FIG. 13, a plurality of opening OP1 is then formed in the substrate 600 at the side 700 through conventional photolithography and etching steps (both not shown). The openings OP1 are isolated from each other and define a plurality of active regions A and a plurality of cutting regions S over the substrate 600. As shown in FIG. 13, each of the openings OP1 are formed with a depth D of about 100~200 μm from a top surface of the substrate 600. The image sensing elements 602 are formed in portions of the substrate 600 in the active regions A.

Figure 14:
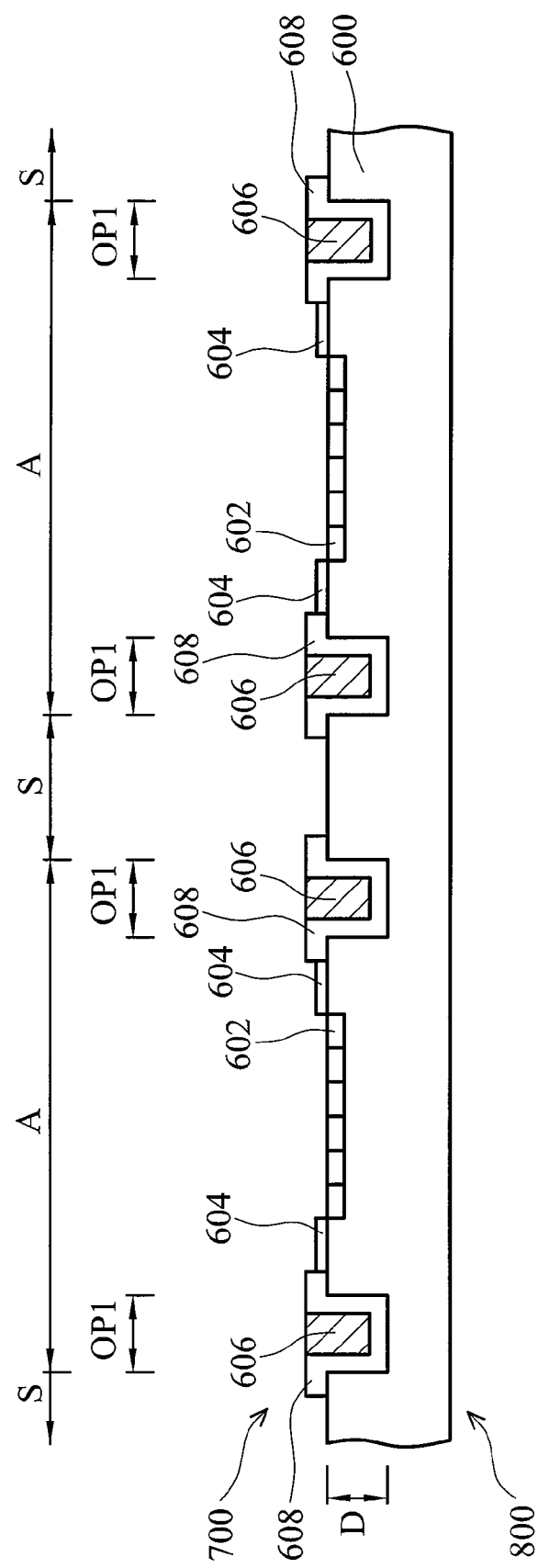

In FIG. 14, a layer of insulating material (not shown) is then conformably formed over the substrate 600 from the side 700 and in the openings OP1 illustrated in FIG. 13. A layer of conductive material is blanketly formed over the layer of insulating material and fills the openings OP1. The portion of the conductive material above the insulating material is then removed by a planarization step (not shown), such as a chemical mechanical polishing (CMP), thereby respectively leaving a conductive via 606 in each of the openings OP1. The layer of insulating material is then patterned by conventional photolithography and etching steps (both not shown) to expose the contact pads 604 and image sensing elements 602 previously formed on and in the substrate 600 in the active regions A, thereby leaving an insulating layer 608 in each of the openings OP1 and on portions of the substrate 600 adjacent thereto. As shown in FIG. 14, a portion of the layer of insulating material in the cutting regions S is also removed. Removal of the insulating material in the cutting regions S is optional. The conductive via 606 is now substantially coplanar with the insulating layer 608 and is isolated from the substrate 600 by the insulating layer 608. In some embodiment, the insulating layer 608 may comprise oxide and the conductive vias 606 comprise copper, tungsten, or conductive epoxy.

Figure 15:
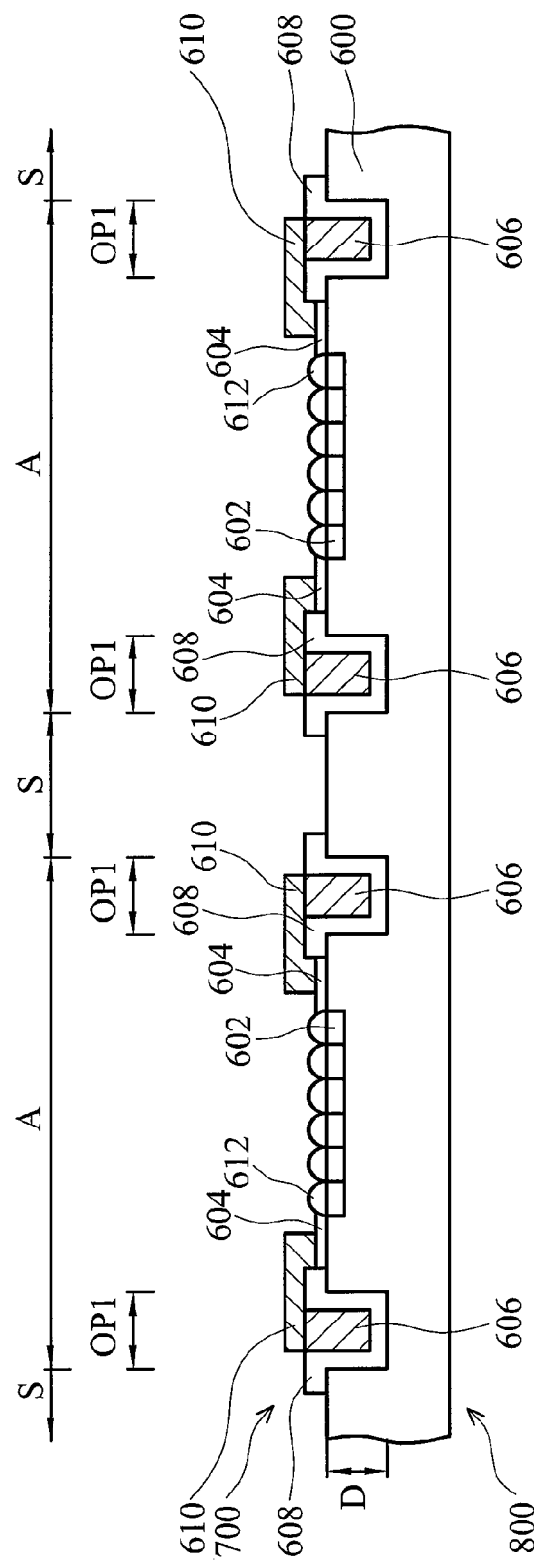

In FIG. 15, an internal structure (not shown) including functional components such as color filter layers for color image presentation and conductive vias or lines insulated by dielectric materials for conducting signal interconnection is formed over the substrate 600 in the active regions but are not shown here, for simplicity. A conductive pad 610 is then formed over each of conductive via 606 and portions of the contact pads 604, thereby electrically connecting the image sensing elements 602. A plurality of microlenses 612 are then formed over the internal structure (not shown) in the active regions A and substantially align with the underlying image sensing elements 602, respectively.

Figure 16:
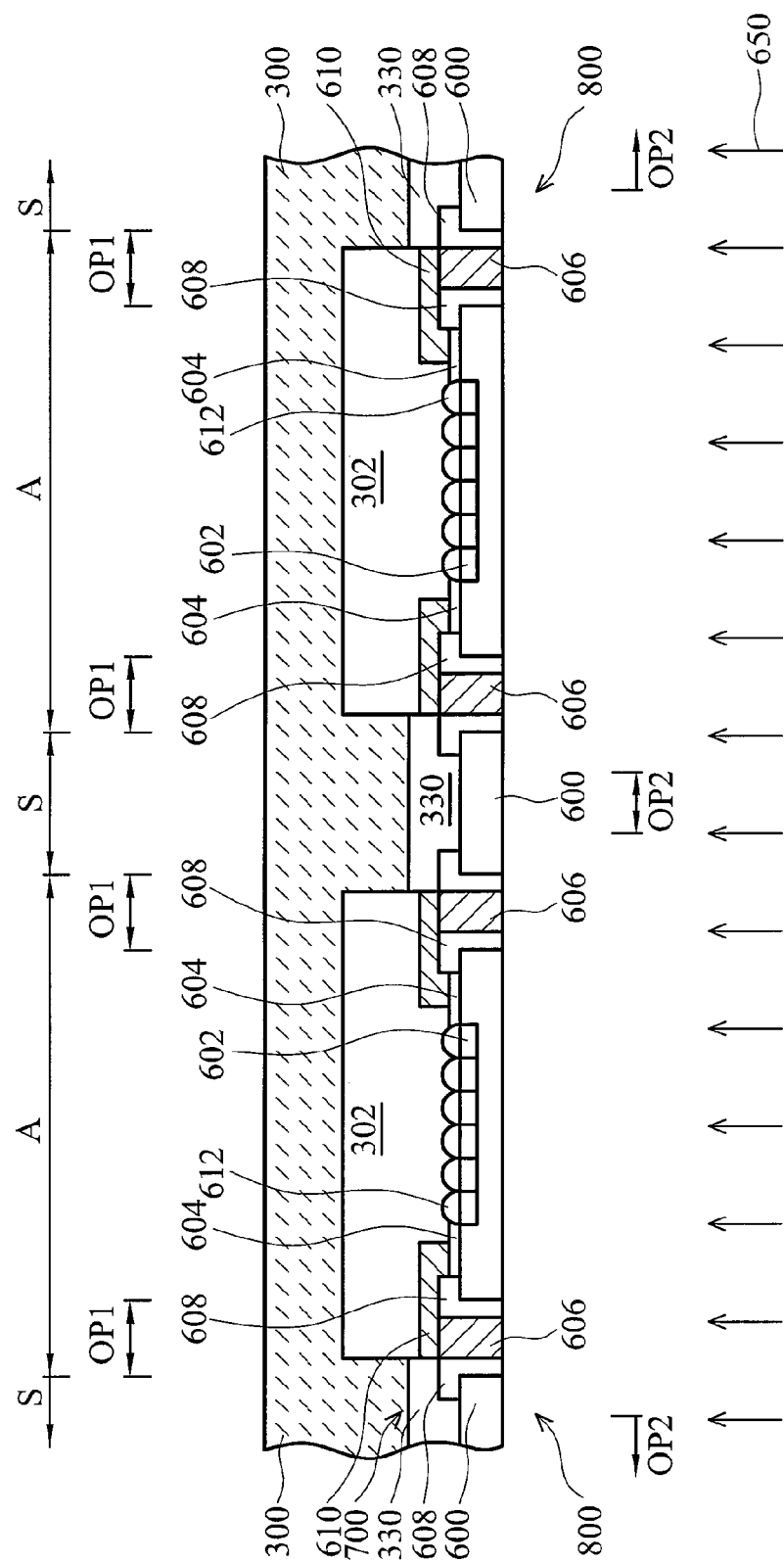

In FIG. 16, a transparent substrate 300, for example glass substrate or plastic substrate, is then bonded with the structure as illustrated in FIG. 15 from the side 700 of the substrate 600. The transparent substrate 300 is bonded with the substrate 600 by methods such as glue adhesion. Thus a glue layer 330 is formed between the transparent substrate 300 and the substrate 600 and the glue layer 330. As shown in FIG. 16, the transparent substrate 300 is formed with recesses therein defined by a plurality of dam structures 350 thereon. At this time, these dam structures 350 are integrated with transparent substrate 300 as a part thereof. The dam structures 350 are formed by performing conventional photolithography and etching steps (both not shown) to the transparent substrate 300 and thereby define recesses between. The recesses of the transparent substrate 300 substantially locate at a position over the active regions A of the substrate 600 and the glue layer substantially locate at a position over the substrate 600 and the insulating layer 608 in the cutting regions S. Cavities 302 are thus formed between the substrate 600 and the transparent substrate 300 and spaces do exist between the microlenses 612 and the transparent substrate 300. Next, a thinning process 650 is next performed on the substrate 600 from the side 800 thereof, thereby expose a surface of the conductive vias 606 near the side 800 of the substrate 600. The thinning process 650 may comprise multiple processing steps such as grinding, etching or other film thickness reducing steps. Portions of the insulating layer 608 are also removed in the thinning process 650.

Figure 17:
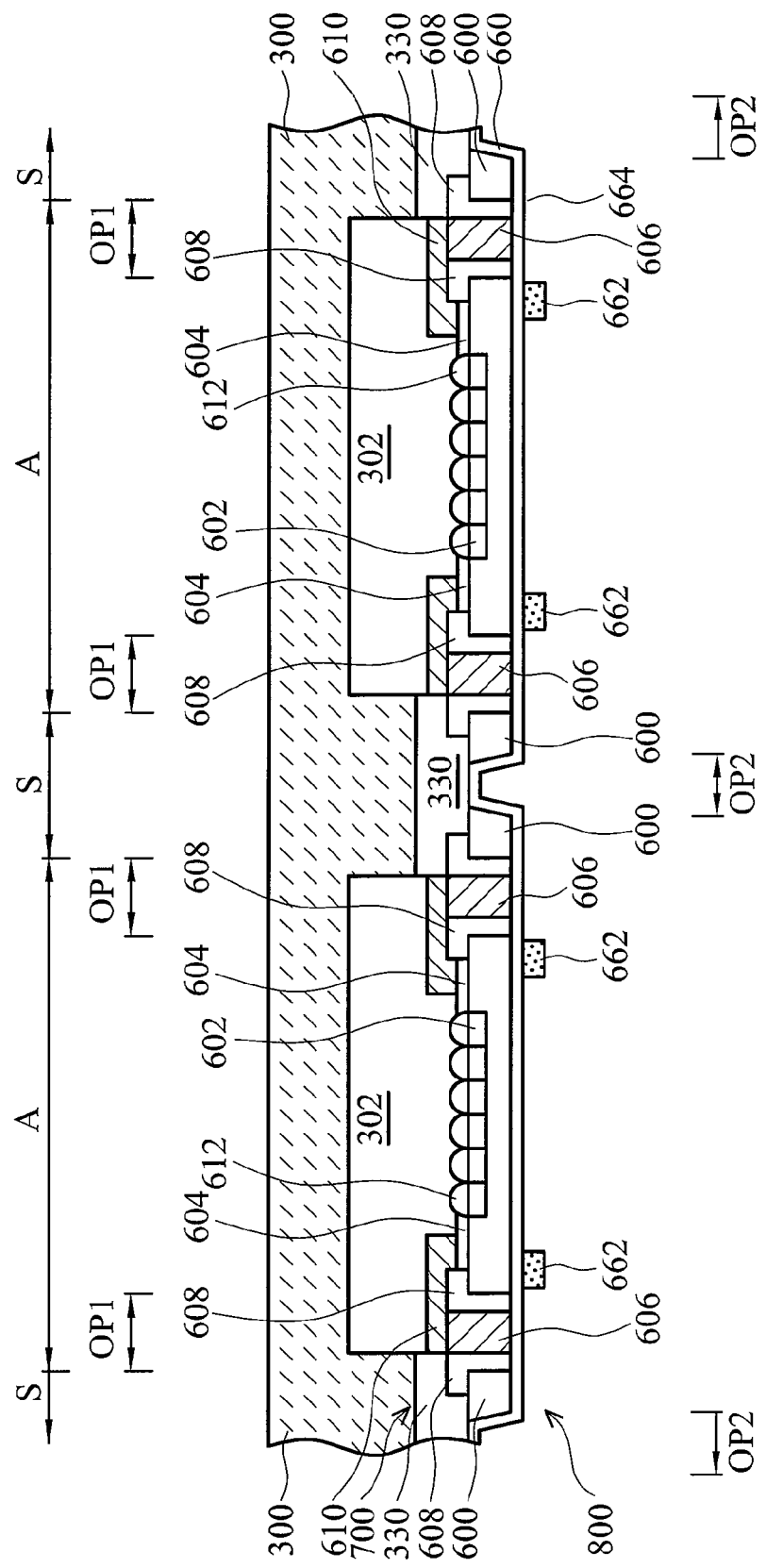

In FIG. 17, portions the substrate 600 in the cutting regions S illustrated in FIG. 16 is etched from the side 800 thereof, thereby forming a plurality of openings OP2 therein. A dielectric layer 660 is then conformably formed over the substrate 600 and in the openings OP2 from the side 800 thereof. Next, a patterned post layer 662 is formed over portions of the dielectric layer 660 as a CTE buffering layer for adjusting CTE difference between the dielectric layer 660 and the sequentially formed layers (not shown). As shown in FIG. 17, the dielectric layer 660 may comprise oxide, nitride or epoxy. The patterned post layers 662 may comprise polyimide, benzocyclobutene (BCB) or epoxy.

Figure 18:
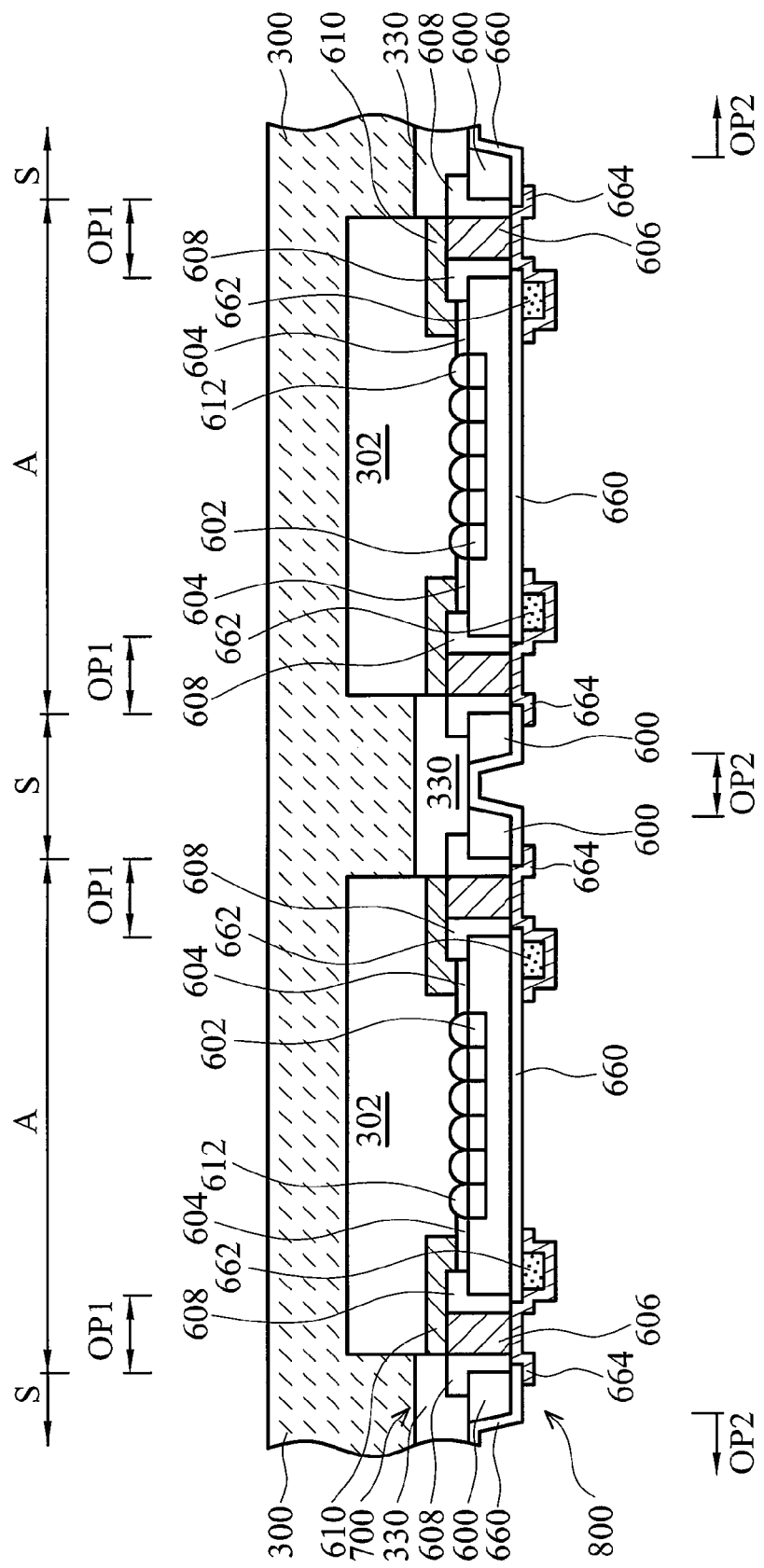

In FIG. 18, portions of the dielectric layer 660 are moved to expose each of the conductive vias 606. A layer of conductive material is then conformably formed over the dielectric layer 660, the post layer 662 and the conductive vias 606 and is then patterned to leave a conductive layer 664 overlying the substrate 200 and physically contacting with the conductive vias 606. The conductive layer 664 also overlies the post layer 662.

Figure 19:
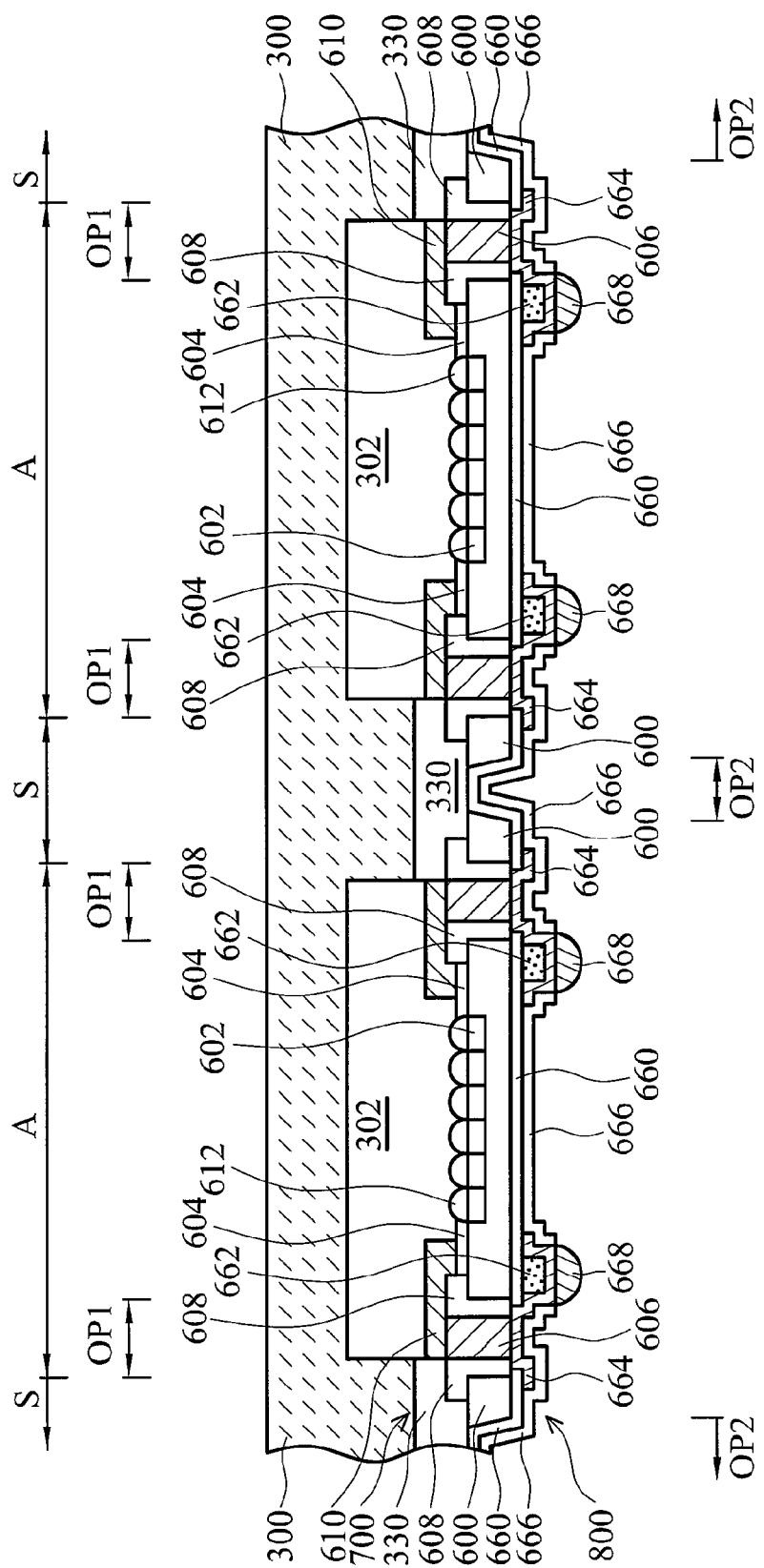

In FIG. 19, a layer of passivation material such as epoxy is then conformally formed over the structure illustrated in FIG. 18 from the side 800 and is patterned to leave a passivation layer 666 overlying the dielectric layer 260 and the conductive layers 264. The passivation layer 666 is next partially removed to expose portions of the conductive layer 664 as a place for planting conductive bump thereon. Next, a conductive bump 668 is formed on each of the conductive layer 664 exposed by the passivation layer 666.

Figure 20:
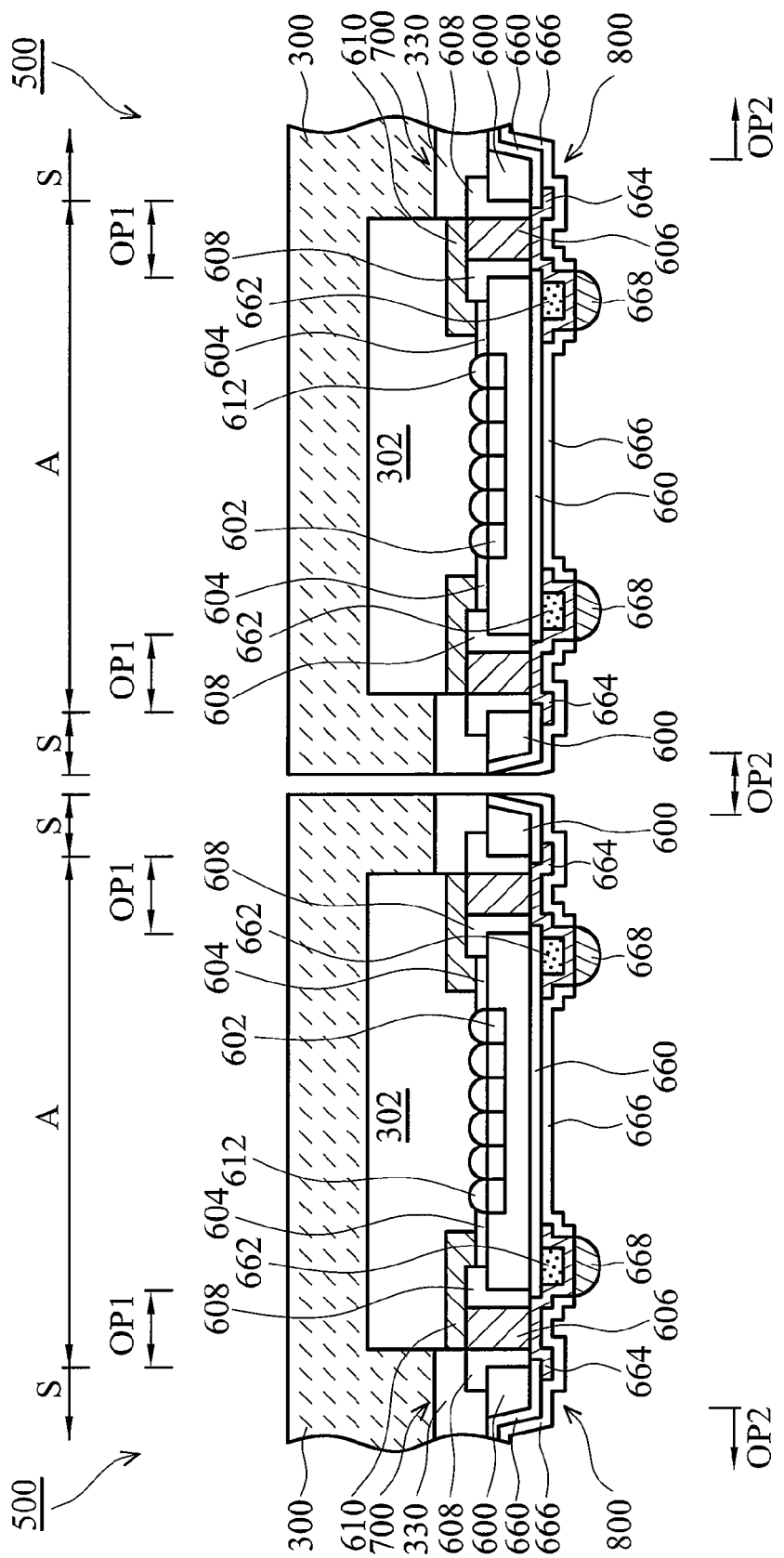

In FIG. 20, the structure illustrated in FIG. 19 is then diced for separation at a place near the opening OP2 in the cutting region S, thereby forming a plurality of image sensing device packages 500.

Figure 21:
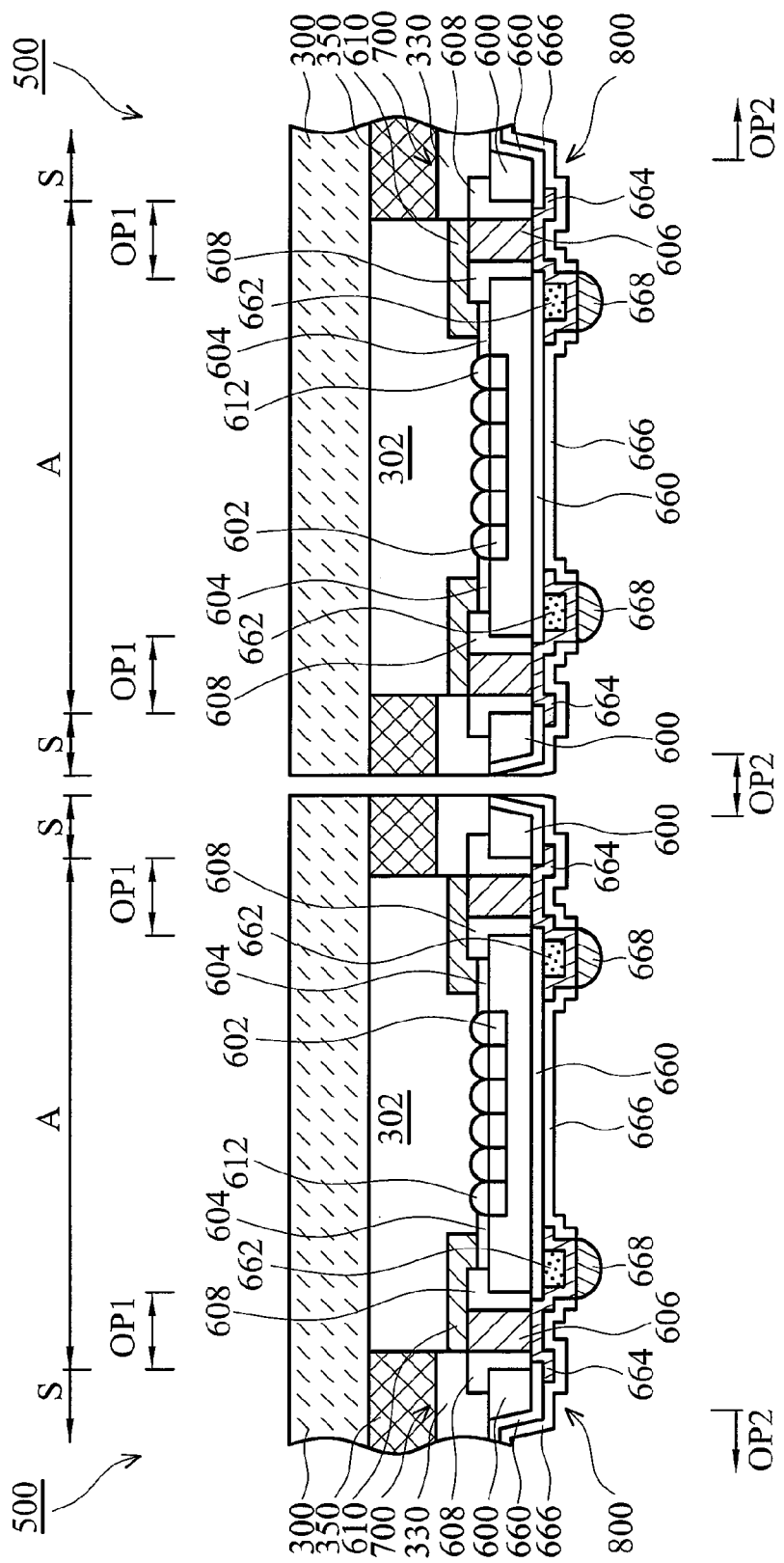

FIG. 21 is a schematic diagram showing another exemplary embodiment of image sensing device packages. Compared with the image sensing device packages 500 illustrated in FIG. 20, the dam structures 350 illustrated in FIG. 21 are different and are not integrated as a part of the transparent substrate 300. The dam structures 350 illustrated in FIG. 21 are now formed by spacers such as ball or roller of glass, plastic or silica materials typically used in liquid crystal display (LCD) fabrication and the transparent substrate 300 here is not processed by any etching process and no recess is formed therein. The height of the dam structure 350 can be adjusted by adding or reducing the amount of the photospacer material and fabrication thereof is well known to those skilled in the art.

In the above exemplary embodiments described through illustrations of FIGS. 12~21, the conductive vias 606 are now formed through the substrate 600 with image sensing elements formed thereon and the conductive pad 610 physically contacting the conductive via 606 electrically connect the image sensing elements by the contact pad 604. The conductive bumps 668 can thus electrically connect the image sensing elements formed in the substrate 600 through connections of the conductive layer 664, the conductive vias 606, the conductive pads 210 and the contact pads 604, thereby forming a conductive path therebetween. Compared with the conventional integrated circuit package as illustrated in FIG. 1, because the conductive vias 606, the conductive pads 610 and the contact pads 604 in the described embodiments are embedded within the image sensing devices rather than formed as a side of the package, a more robust package structure is thus formed. Disconnection between the contact pads 604, the conductive pads 610 and the conductive vias 606 can be also prevented because the contact pads 604, the conductive pads 610 and the conduct plugs 204 contact a top surface of other layers, thereby having a greater contact area therebetween. Additionally, package size of the image sensing device can be reduced through the described configuration. Moreover, because the conductive bumps 662 are indirectly contact the conductive vias 606 through connections of the conductive layers 664 and the post layers 662 are also provided between the conductive layer 664 and the passivation layer 660 for adjusting CTE mismatch therebetween, delamination of the conductive vias 606, the conductive layers 660 and/or the conductive bumps is thus eliminated.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Thus, the scope of the appended claims should be accorded the broadest interpretation so as to encompass all such modifications and similar arrangements.

What is claimed is:

1. An image sensing device, comprising:
    a first substrate having a first side and a second side opposing each other;
    a plurality of image sensing elements formed in the first substrate at the first side;
    a plurality of microlenses formed over the image sensing elements in the first substrate at the first side, substantially aligning therewith;
    a conductive via formed through the first substrate, having a first surface exposed by the first substrate at the first side and a second surface exposed by the first substrate at the second side;
    a conductive pad formed over portions of the first substrate at the first side, overlying the conductive via and electrically connecting the image sensing elements;
    a conductive layer formed over portions of the first substrate at the second side thereof, overlying the conductive via and electrically connecting the conductive pad;
    a conductive bump formed over a portion of the conductive layer; and
    a second substrate bonded with the first substrate at the first side, wherein the second substrate is formed with a recess therein and thereby forms a cavity between the first and the second substrates, and the microlenses are encapsulated by the cavity.

2. The image sensing device as claimed in claim 1, wherein the second substrate is a transparent substrate.

3. The image sensing device as claimed in claim 1, wherein the first substrate is a semiconductor substrate.

4. The image sensing device as claimed in claim 1, wherein the second substrate comprises a plurality of dam structures bonded with the first substrate, thereby defining the recess.

5. The image sensing device as claimed in claim 4, wherein the dam structures are formed as a part of the second substrate.

6. The image sensing device as claimed in claim 4, wherein the second substrate is a glass substrate and the dam structures are ball or roller.

7. The image sensing device as claimed in claim 6, wherein the balls or rollers comprise glass, plastic and silica material.

8. The image sensing device as claimed in claim 1, further comprising a passivation layer formed over portions of the conductive layer and expose a portion of the conductive layer for plating of the conductive bump.

9. The image sensing device as claimed in claim 8, wherein the passivation layer comprises epoxy.

10. The image sensing device as claimed in claim 1, further comprising an insulating layer formed between the conductive via and the first substrate.

11. The image sensing device as claimed in claim 10, wherein the insulating layer material comprises oxide, nitride, or epoxy.

* * * * *